US007671663B2

(12) United States Patent
Houston et al.

(10) Patent No.: US 7,671,663 B2
(45) Date of Patent: Mar. 2, 2010

(54) TUNABLE VOLTAGE CONTROLLER FOR A SUB-CIRCUIT AND METHOD OF OPERATING THE SAME

(75) Inventors: Theodore W. Houston, Richardson, TX (US); Michael P. Clinton, Allen, TX (US); Robert L. Pitts, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 185 days.

(21) Appl. No.: 11/609,678

(22) Filed: Dec. 12, 2006

(65) Prior Publication Data

US 2008/0136497 A1 Jun. 12, 2008

(51) Int. Cl.
*H03K 3/01* (2006.01)

(52) U.S. Cl. ...................................... 327/534; 327/544

(58) Field of Classification Search ................. 327/534, 327/544

See application file for complete search history.

(56) References Cited

U.S. PATENT DOCUMENTS

| | | | | |
|---|---|---|---|---|
| 6,049,245 | A * | 4/2000 | Son et al. | 327/544 |
| 6,097,113 | A * | 8/2000 | Teraoka et al. | 307/125 |
| 6,466,077 | B1 * | 10/2002 | Miyazaki et al. | 327/534 |
| 6,605,981 | B2 * | 8/2003 | Bryant et al. | 327/534 |
| 6,885,234 | B2 * | 4/2005 | Ando | 327/534 |

* cited by examiner

*Primary Examiner*—Lincoln Donovan
*Assistant Examiner*—John W Poos
(74) *Attorney, Agent, or Firm*—Warren L. Franz; Wade J. Brady, III; Frederick J. Telecky, Jr.

(57) ABSTRACT

The present invention provides a tunable voltage controller for use with a sub-circuit. In one embodiment, the tunable voltage controller includes a diode-connected MOS transistor contained in a doped well of a substrate and configured to provide a voltage for the sub-circuit. Additionally, the tunable voltage controller also includes a biasing unit configured to adjust the voltage by selectively connecting the doped well to one of a plurality of voltage sources or to a variable voltage source.

38 Claims, 2 Drawing Sheets

TUNABLE VOLTAGE CONTROLLER FOR A SUB-CIRCUIT AND METHOD OF OPERATING THE SAME

TECHNICAL FIELD OF THE INVENTION

The present invention is directed, in general, to microelectronics and, more specifically, to a tunable voltage controller, a method of operating a tunable voltage controller and an integrated circuit employing the controller or the method.

BACKGROUND OF THE INVENTION

Supplying or removing power, either partially or completely, from a block of circuitry may be controlled by header or footer circuits. The header circuit forms a controllable switch between a positive supply voltage and a block of sub-circuits. Similarly, the footer circuit forms a controllable switch between a negative supply voltage and the sub-circuit block. Activation of the header or footer circuits allows a virtual operating supply voltage to be connected to the sub-circuit block. Deactivation of the header or footer circuits provides a standby voltage for the sub-circuit block.

A conventional approach to providing an operating virtual voltage to the sub-circuit uses a conducting header or footer MOS transistor. Then, the forward voltage drop of a separate, external junction diode that is parallel-connected with the MOS transistor is used to provide a standby voltage for the sub-circuit when the operating voltage MOS transistor is not conducting. Alternatively, another parallel MOS transistor connected as a diode can be used to provide a standby voltage for the sub-circuit when the operating voltage MOS transistor is not conducting. However, the voltage drop obtained with either the external junction diode or the diode-connected transistor is usually not optimal, especially over a range of fabrication process variations and for different applications.

Accordingly, what is needed in the art is a more effective way of obtaining a voltage, such as a standby voltage, that is tunable and also maintains the power and area advantages of a diode-connected transistor.

SUMMARY OF THE INVENTION

To address the above-discussed deficiencies of the prior art, the present invention provides a tunable voltage controller for use with a sub-circuit. In one embodiment, the tunable voltage controller includes a diode-connected MOS transistor contained in a doped well of a substrate and configured to provide a voltage for the sub-circuit. Additionally, the tunable voltage controller also includes a biasing unit configured to adjust the voltage by selectively connecting the doped well to one of a plurality of voltage sources or to a variable voltage source.

In another aspect, the present invention provides a method of operating a tunable voltage controller for use with a sub-circuit. The method includes providing a voltage for the sub-circuit by employing a diode-connected MOS transistor contained in a doped well of a substrate. The method also includes adjusting the voltage by selectively connecting the doped well to one of a plurality of voltage sources or to a variable voltage source.

The present invention also provides, in yet another aspect, an integrated circuit. The integrated circuit includes a voltage supply bus and a MOS transistor switch connected between the voltage supply bus and a sub-circuit. The integrated circuit also includes a tunable voltage controller parallel connected with the MOS transistor switch to the sub-circuit. The tunable voltage controller has a diode-connected MOS transistor contained in a doped well of a substrate and a biasing unit that selectively connects the doped well to one of a plurality of voltage sources or to a variable voltage source.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
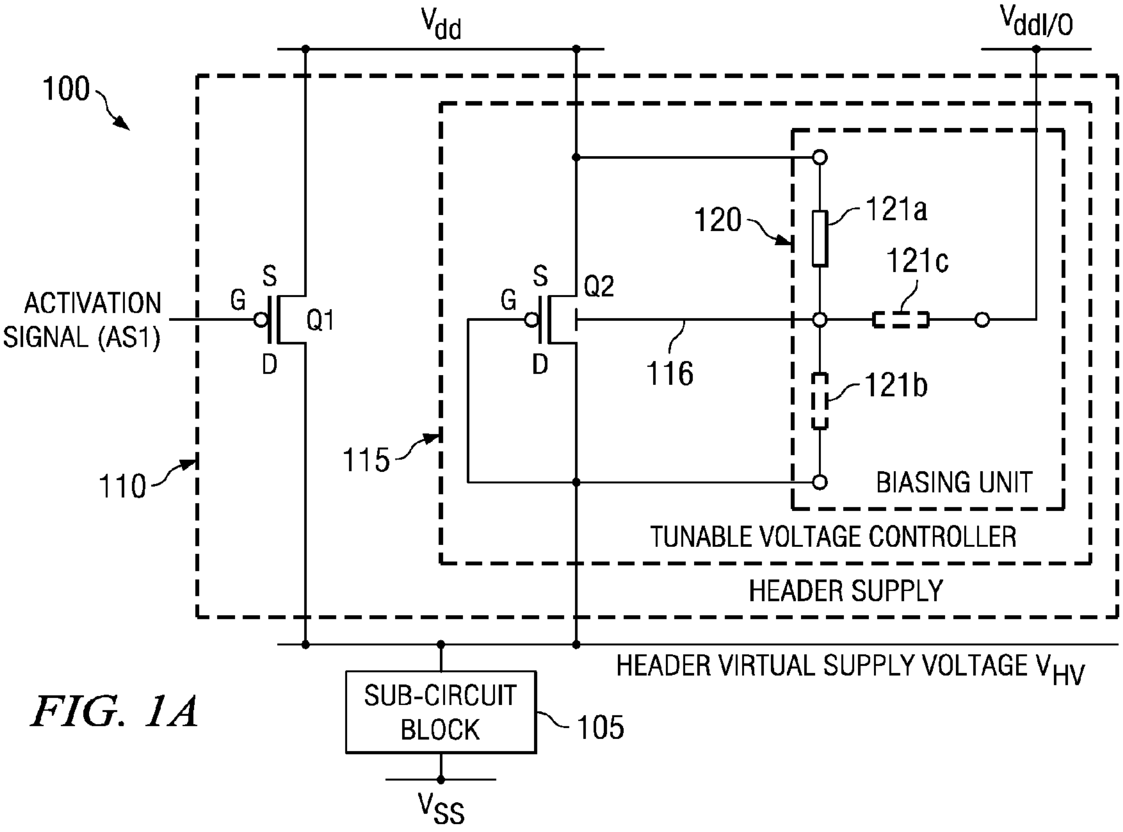
FIGS. 1A and 1B illustrate embodiments of integrated circuits constructed according to principles of the present invention.
Figure 1B:
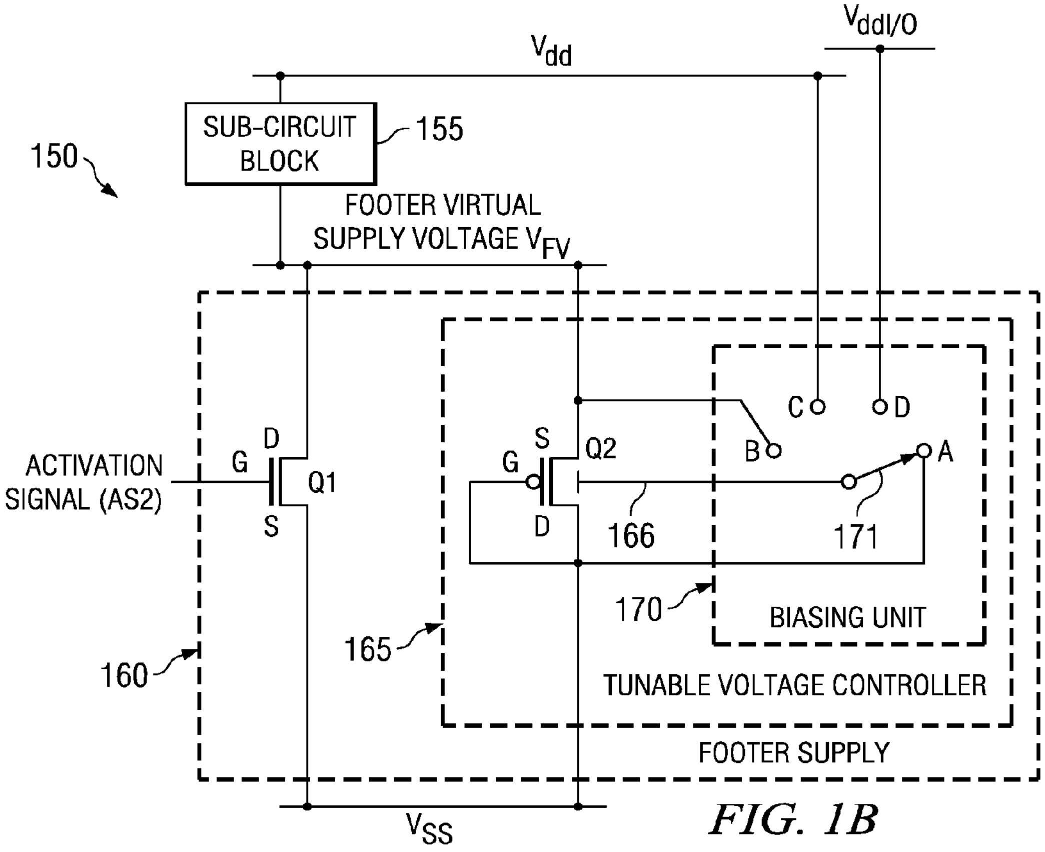

FIGS. 1A and 1B illustrate embodiments of integrated circuits, generally designated 100 and 150, constructed according to principles of the present invention. In each of these embodiments, a virtual supply voltage for a sub-circuit, such as an SRAM array for example, is provided from a static supply voltage and controlled by MOS transistor switches. In the embodiments discussed, a PMOS transistor connected as a diode is employed that has the option of connecting an associated N-WELL to different voltages thereby adjusting the threshold voltage $V_t$ of the PMOS transistor. This results in a corresponding change in a voltage drop across the diode-connected PMOS transistor thereby adjusting a voltage for the sub-circuit. Of course, one skilled in the pertinent art recognizes that another embodiment of the present invention having an NMOS transistor connected as a diode with an isolated P-WELL may also be employed.

FIG. 1A, the integrated circuit 100 includes a sub-circuit block 105 and a header supply 110. The header supply 110 is coupled to a header voltage supply bus that provides a header supply voltage Vdd and, correspondingly, a header virtual supply voltage VHV to the sub-circuit block 105. The sub-circuit block 105 is also coupled to a footer voltage supply bus that provides a footer supply voltage Vss, which is lower in potential than the header supply voltage Vdd. The header supply 110 includes a PMOS transistor switch Q1 and a tunable voltage controller 115. The PMOS transistor switch Q1 is coupled to the header supply voltage Vdd and provides an operating voltage as the header virtual supply voltage VHV for the sub-circuit block 105 during switch activation. Switch activation is provided by an activation signal AS1.

The tunable voltage controller 115 includes a diode-connected PMOS transistor Q2 and a biasing unit 120. In the illustrated embodiment, the diode-connected PMOS transistor Q2 is contained in an N-WELL 116, which is electrically isolated from a substrate containing the PMOS transistor Q2 and the N-WELL 116. Additionally, the biasing unit 120 employs a collection of fusible links that are configured to provide hard-wired connections between the N-WELL 116 and a plurality of voltage sources.

The biasing unit 120 includes a first fusible link 121*a* that connects the N-WELL 116 to a source of the diode-connected PMOS transistor Q2, wherein the source is also connected to the header supply voltage $V_{dd}$, as shown. A second fusible link 121*b* is connected to a drain of the diode-connected PMOS transistor Q2, and a third fusible link 121*c* is connected to an input/output supply voltage $V_{ddI/O}$ that is associated with the sub-circuit block 105. The second and third fusible links 121*b*, 121*c* have been opened since only one fusible link (corresponding to only one of the plurality of available biasing voltage sources) may be connected at any one time to the diode-connected PMOS transistor Q2. Selection of an appropriate biasing voltage thereby allows tuning of a standby voltage as the header virtual supply voltage $V_{HV}$ for the sub-circuit block 105 during deactivation of the PMOS transistor switch Q1.

In FIG. 1B, the integrated circuit 150 includes a sub-circuit block 155 and a footer supply 160. The footer supply 160 is coupled to a footer voltage supply bus that provides a footer supply voltage $V_{ss}$ and, correspondingly, a footer virtual supply voltage $V_{FV}$ to the sub-circuit block 155. The sub-circuit block 155 is also coupled to a header voltage supply bus that provides a header supply voltage $V_{dd}$, which is higher in potential than the footer supply voltage $V_{ss}$.

The footer supply 160 includes an NMOS transistor switch Q1 and a tunable voltage controller 165. The NMOS transistor switch Q1 is coupled to the footer supply voltage $V_{ss}$ and provides an operating voltage as the footer virtual supply voltage $V_{FV}$ for the sub-circuit block 155 during switch activation. Switch activation is provided by another activation signal AS2, which has an opposite polarity compared to the activation signal AS1 needed for activation of the PMOS transistor switch Q1 employed in FIG. 1A.

The tunable voltage controller 165 includes a diode-connected PMOS transistor Q2 and a biasing unit 170. In the illustrated embodiment, the diode-connected PMOS transistor Q2 is contained in an N-WELL 166, which is electrically isolated from a substrate containing the PMOS transistor Q2 and the N-WELL 166. Additionally, the biasing unit 170 employs a switching unit 171 (herein shown symbolically) to selectively connect the N-WELL 166 to one of several discrete biasing voltages. This arrangement provides a "stepwise" variable biasing voltage source.

In an alternative embodiment, the switching unit 171 may be configured to employ a continuously variable biasing voltage source that provides a continuous range of biasing voltages to the N-WELL 166. In either embodiment, the stepwise variable biasing voltage source or the continuously variable voltage biasing source may provide multiple voltage adjustments during regular or standby operation of a sub-circuit block as may be appropriate to a particular application.

In the illustrated embodiment of FIG. 1B, connection of the switching unit 171 to a contact A, as shown, connects the N-WELL to a drain of the diode-connected PMOS transistor Q2, which is also connected to the footer supply voltage $V_{ss}$. Similarly, contacts B, C, D connect the N-WELL to a source of the diode-connected PMOS transistor Q2, the header supply voltage $V_{dd}$ and an input/output supply voltage $V_{ddI/O}$ that is associated with the sub-circuit block 155, respectively. In the illustrated embodiment, selection of an appropriate biasing voltage source allows selection of a standby voltage as the footer virtual supply voltage $V_{FV}$ for the sub-circuit block 155 during deactivation of the NMOS transistor switch Q1.

In each of the integrated circuits 100, 150, the biasing units 120, 170 respectively connect the N-WELL to a biasing voltage source that tunes a voltage drop across the diode-connected PMOS transistor Q2. This thereby respectively adjusts the standby voltage for the sub-circuit blocks 105, 155 during deactivation of the MOS transistor switch Q1. For a lowest voltage drop (and therefore the highest standby voltage) the respective N-WELL is connected to the respective source of the diode-connected PMOS transistor Q2. This will forward bias the p-n junction in a way that contributes to a limiting of the voltage drop.

For a larger voltage drop, the respective N-WELL and drain of the diode-connected PMOS transistor Q2 may be connected. This eliminates the forward-biased p-n junction and also raises the threshold voltage Vt of the diode-connected PMOS transistor Q2. The voltage drop may be increased further by connecting the respective N-WELL to the supply voltage Vdd or even farther by connecting the respective N-WELL to the input/output supply voltage $V_{ddI/O}$, when available.

Therefore, a fusible link may be employed after fabrication for a single adjustment in the voltage drop across the diode-connected MOS transistor to allow for process or other variations. Additionally, a mask selection for a particular application requirement may also be employed to provide a hard-wired connection of a doped well containing the diode-connected MOS transistor to a biasing voltage source. Alternatively, multiple adjustments of the voltage drop across the diode-connected MOS transistor may be provided during either regular or standby operation.

Figure 2:
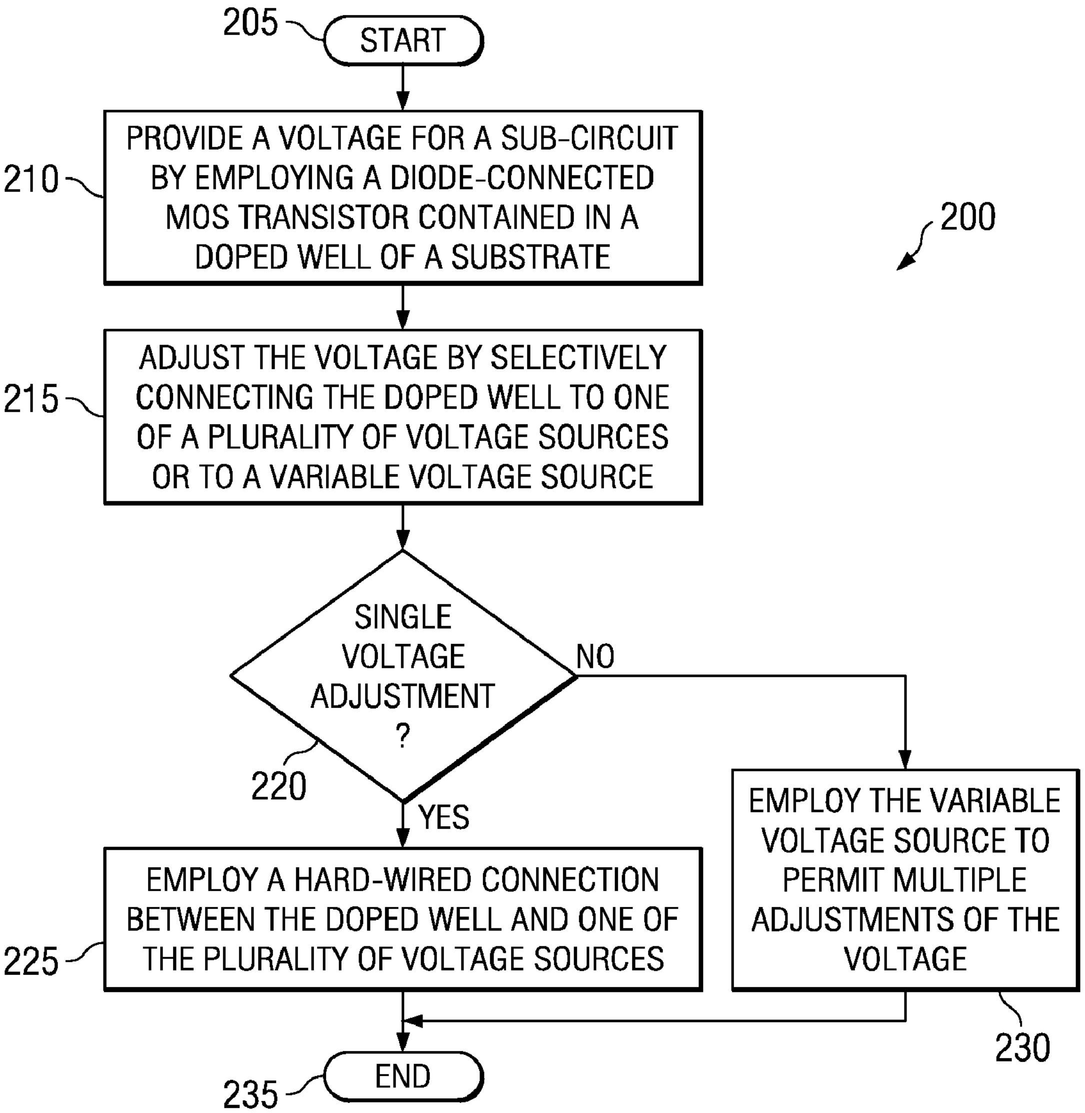
FIG. 2 illustrates a flow diagram of an embodiment of a method of operating a tunable voltage controller carried out in accordance with the principles of the present invention.

FIG. 2 illustrates a flow diagram of an embodiment of a method of operating a tunable voltage controller, generally designated 200, carried out in accordance with the principles of the present invention. The method 200 is for use with a sub-circuit and starts in a step 205. Then, in a step 210, a voltage is provided for the sub-circuit by employing a diode-connected MOS transistor contained in a doped well of a substrate. The voltage provided may be employed as an operating voltage in one embodiment or as a standby voltage for the sub-circuit in another embodiment. In one embodiment, the diode-connected MOS transistor is a diode-connected PMOS transistor, and the doped well is an N-WELL. In another embodiment, the diode-connected MOS transistor is a diode-connected NMOS transistor, and the doped well is a P-WELL that is electrically isolated from the substrate.

The voltage is adjusted by selectively connecting the doped well to one of a plurality of voltage sources or to a variable voltage source, in a step 215. The step 215 allows tuning a voltage drop across the diode-connected MOS transistor and thereby adjusting the voltage for the sub-circuit. In one embodiment, one of the plurality of voltage sources or the variable voltage source employs a drain of the diode-connected MOS transistor. In another embodiment, one of the plurality of voltage sources or the variable voltage source employs a source of the diode-connected MOS transistor. In alternative embodiments, one of the plurality of voltage sources or the variable voltage source employs a supply voltage or an input/output supply voltage associated with the sub-circuit.

In a decisional step 220, it is determined whether a single voltage adjustment is to be made for the sub-circuit. If a single voltage adjustment is to be made, a hard-wired connection is made between the doped well and one of the plurality of voltage sources in a step 225. In one embodiment, the hard-wired connection employs a fusible link. The method 200 then ends in a step 235. If more than a single voltage adjustment is to be made, the variable voltage source is employed to permit connecting the doped well to more than one voltage in a step 230. The method again ends in the step 235.

While the method disclosed herein has been described and shown with reference to particular steps performed in a particular order, it will be understood that these steps may be combined, subdivided, or reordered to form an equivalent method without departing from the teachings of the present invention. Accordingly, unless specifically indicated herein, the order or the grouping of the steps is not a limitation of the present invention.

In summary, embodiments of the present invention employing a tunable voltage controller, a method of operating a tunable voltage controller and an integrated circuit employing the controller or the method have been presented. These embodiments provide a standby voltage for a sub-circuit and include an exemplary PMOS transistor connected as a diode, which has the option of connecting its associated N-WELL to different biasing voltage sources. This allows adjustment of the threshold voltage of the PMOS transistor, the voltage drop across it and the corresponding voltage provided to the sub-circuit. Of course, other embodiments of the present invention may employ a diode-connected NMOS transistor with an isolated P-WELL, where appropriate.

Using back gate bias to adjust the threshold voltage of a diode-connected MOS transistor allows use of a smaller area than employing multiple junction diodes. Additionally, embodiments of the diode-connected MOS transistor also typically require smaller area and overhead power as compared to using a low dropout (LDO) regulator. Also, extending the back gate bias to include connecting the back gate to the MOS transistor source provides a lower voltage drop than previous diode connections.

Those skilled in the art to which the invention relates will appreciate that other and further additions, deletions, substitutions and modifications may be made to the described embodiments without departing from the scope of the invention.

What is claimed is:

1. A tunable voltage controller for use in a voltage supply responsive to an activation signal for providing an operating voltage or a standby voltage for a sub-circuit, the controller comprising:

a diode-connected MOS transistor contained in a doped well of a substrate and configured to provide the standby voltage for said sub-circuit; and a biasing unit configured to adjust said standby voltage by selectively connecting said doped well to one of a plurality of voltage sources;

wherein said biasing unit comprises an element for selectively connecting said doped well to a drain of said diode-connected MOS transistor.

2. The controller as recited in claim 1, wherein selectively connecting said doped well to one of said plurality of voltage sources employs a hard-wired connection.

3. The controller as recited in claim 1, wherein selectively connecting said doped well to said variable voltage source permits multiple adjustments of said voltage.

4. The controller as recited in claim 1, wherein said biasing unit further comprises another element for selectively connecting said doped well to a source of said diode-connected MOS transistor.

5. The controller as recited in claim 4, wherein said biasing unit further comprises yet another element for selectively connecting said doped well to an input/output supply voltage source associated with said sub-circuit.

6. The controller as recited in claim 5, wherein said element, said another element and said yet another element comprise fusible links.

7. A tunable voltage controller for use with a sub-circuit, comprising:

a diode-connected MOS transistor contained in a doped well of a substrate and configured to provide a voltage for said sub-circuit; and a biasing unit configured to adjust said voltage by selectively connecting said doped well to one of a plurality of voltage sources or to a variable voltage source;

wherein said plurality of voltage sources or said variable voltage source employs a source of said diode-connected MOS transistor.

8. A tunable voltage controller for use with a sub-circuit, comprising:

a diode-connected MOS transistor contained in a doped well of a substrate and configured to provide a voltage for said sub-circuit; and a biasing unit configured to adjust said voltage by selectively connecting said doped well to one of a plurality of voltage sources or to a variable voltage source;

wherein selectively connecting said doped well to one of said plurality of voltage sources employs a hard-wired connection; and said hard-wired connection employs a fusible link.

9. The controller as recited in claim 8, wherein said diode-connected MOS transistor is a diode-connected PMOS transistor and said doped well is an N-WELL.

10. The controller as recited in claim 8, wherein said plurality of voltage sources or said variable voltage source employs an input/output supply voltage associated with said sub-circuit.

11. A method of operating a tunable voltage controller for use with a sub-circuit, comprising:

providing a voltage for said sub-circuit by employing a diode-connected MOS transistor contained in a doped well of a substrate; and adjusting said voltage by selectively connecting said doped well to one of a plurality of voltage sources or to a variable voltage source;

wherein said plurality of voltage sources or said variable voltage source employs a drain of said diode-connected MOS transistor.

12. The method as recited in claim 11, wherein said plurality of voltage sources or said variable voltage source further employs a supply voltage associated with said sub-circuit.

13. The method as recited in claim 11, wherein said plurality of voltage sources or said variable voltage source further employs an input/output supply voltage associated with said sub-circuit.

14. The method as recited in claim 11, wherein selectively connecting said doped well to one of said plurality of voltage sources employs a hard-wired connection.

15. The method as recited in claim 11, wherein selectively connecting said doped well to said variable voltage source permits multiple adjustments of said voltage.

16. A method of operating a tunable voltage controller for use with a sub-circuit, comprising:

providing a voltage for said sub-circuit by employing a diode-connected MOS transistor contained in a doped well of a substrate; and adjusting said voltage by selectively connecting said doped well to one of a plurality of voltage sources or to a variable voltage source;

wherein said plurality of voltage sources or said variable voltage source employs a source of said diode-connected MOS transistor.

17. A method of operating a tunable voltage controller for use with a sub-circuit, comprising:

providing a voltage for said sub-circuit by employing a diode-connected MOS transistor contained in a doped well of a substrate; and adjusting said voltage by selectively connecting said doped well to one of a plurality of voltage sources or to a variable voltage source;

wherein selectively connecting said doped well to one of said plurality of voltage sources employs a hard-wired connection, and wherein said hard-wired connection employs a fusible link.

18. The method as recited in claim 17, wherein said diode-connected MOS transistor is a diode-connected PMOS transistor and said doped well is an N-WELL.

19. An integrated circuit, comprising:

a voltage supply bus;

a MOS transistor switch connected between said voltage supply bus and a sub-circuit for supplying an operating voltage to said sub-circuit in response to an activation signal;

a tunable voltage controller parallel connected with said MOS transistor switch to said sub-circuit, including:

a diode-connected MOS transistor contained in a doped well of a substrate and connected to provide a standby voltage to said sub-circuit when said MOS transistor is deactivated, and a biasing unit that selectively connects said doped well to one of a plurality of voltage sources to adjust said standby voltage.

20. An integrated circuit, comprising:

a voltage supply bus;

a MOS transistor switch connected between said voltage supply bus and a sub-circuit;

a tunable voltage controller parallel connected with said MOS transistor switch to said sub-circuit, including:

a diode-connected MOS transistor contained in a doped well of a substrate, and a biasing unit that selectively connects said doped well to one of a plurality of voltage sources or to a variable voltage source;

wherein said biasing unit tunes a voltage drop across said diode-connected MOS transistor and thereby adjusts a voltage for said sub-circuit during deactivation of said MOS transistor switch.

21. The integrated circuit as recited in claim 20, wherein said voltage is a standby voltage for said sub-circuit.

22. The integrated circuit as recited in claim 20, wherein said diode-connected MOS transistor is a diode-connected PMOS transistor and said doped well is an N-WELL.

23. The integrated circuit as recited in claim 20, wherein said plurality of voltage sources or said variable voltage source employs a drain of said diode-connected MOS transistor.

24. The integrated circuit as recited in claim 20, wherein selectively connecting said doped well to one of said plurality of voltage sources employs a hard-wired connection.

25. An integrated circuit, comprising:

a voltage supply bus;

a MOS transistor switch connected between said voltage supply bus and a sub-circuit;

a tunable voltage controller parallel connected with said MOS transistor switch to said sub-circuit, including:

a diode-connected MOS transistor contained in a doped well of a substrate, and a biasing unit that selectively connects said doped well to one of a plurality of voltage sources or to a variable voltage source;

wherein said plurality of voltage sources or said variable voltage source employs a source of said diode-connected MOS transistor.

26. An integrated circuit, comprising:

a voltage supply bus;

a MOS transistor switch connected between said voltage supply bus and a sub-circuit;

a tunable voltage controller parallel connected with said MOS transistor switch to said sub-circuit, including:

a diode-connected MOS transistor contained in a doped well of a substrate, and a biasing unit that selectively connects said doped well to one of a plurality of voltage sources or to a variable voltage source;

wherein said plurality of voltage sources or said variable voltage source employs a supply voltage associated with said sub-circuit.

27. An integrated circuit, comprising:

a voltage supply bus;

a MOS transistor switch connected between said voltage supply bus and a sub-circuit;

a tunable voltage controller parallel connected with said MOS transistor switch to said sub-circuit, including:

a diode-connected MOS transistor contained in a doped well of a substrate, and a biasing unit that selectively connects said doped well to one of a plurality of voltage sources or to a variable voltage source;

wherein said plurality of voltage sources or said variable voltage source employs an input/output supply voltage associated with said sub-circuit.

28. An integrated circuit, comprising:

a voltage supply bus;

a MOS transistor switch connected between said voltage supply bus and a sub-circuit;

a tunable voltage controller parallel connected with said MOS transistor switch to said sub-circuit, including:

a diode-connected MOS transistor contained in a doped well of a substrate, and a biasing unit that selectively connects said doped well to one of a plurality of voltage sources or to a variable voltage source;

wherein selectively connecting said doped well to one of said plurality of voltage sources employs a hard-wired connection; and said hard-wired connection employs a fusible link.

29. An integrated circuit, comprising:

a voltage supply bus;

a MOS transistor switch connected between said voltage supply bus and a sub-circuit;

a tunable voltage controller parallel connected with said MOS transistor switch to said sub-circuit, including:

a diode-connected MOS transistor contained in a doped well of a substrate, and a biasing unit that selectively connects said doped well to one of a plurality of voltage sources or to a variable voltage source;

wherein selectively connecting said doped well to said variable voltage source permits multiple adjustments of said voltage.

30. A tunable voltage controller for use with a header or footer voltage supply, the header or footer voltage supply including a MOS transistor connected between a voltage supply bus and a sub-circuit to supply an operating voltage to said sub-circuit; the controller comprising:

a diode-connected MOS transistor configured to be connected parallel to said MOS transistor between said voltage supply bus and said sub-circuit, to supply a standby voltage to said sub-circuit during deactivation of said MOS transistor; the diode-connected MOS transistor being contained in a doped well of a substrate; and a biasing unit configured to adjust said standby voltage by selectively connecting said doped well to one of a plurality of voltage sources, thereby adjusting the threshold voltage of the MOS transistor, resulting in a corresponding change in a voltage drop across the diode-connected MOS transistor, and adjusting the standby voltage for the sub-circuit;

wherein the biasing unit further comprises fusible links configured to selectively provide hard-wired connections between the doped well and respective ones of said plurality of voltage sources.

31. The controller of claim 30, wherein the diode-connected MOS transistor is a PMOS transistor contained in an N-WELL.

32. The controller of claim 30, wherein the fusible links comprise a first fusible link configured to selectively connect the doped well to a source of the diode-connected MOS transistor.

33. The controller of claim 32, wherein the fusible links further comprise a second fusible link configured to selectively connect the doped well to a drain of the diode-connected MOS transistor.

34. The controller of claim 33, wherein the fusible links further comprise a third fusible link configured to selectively connect the doped well to an input/output supply voltage source that is associated with the sub-circuit.

35. The controller of claim 30, wherein the fusible links include at least one fusible link configured to selectively connect the doped well to at least one of a source of the diode-connected MOS transistor, a drain of the diode-connected MOS transistor, or an input/output supply voltage source that is associated with the sub-circuit.

36. A circuit, comprising:

a voltage supply bus;

a MOS transistor connected between said voltage supply bus and a sub-circuit to supply an operating voltage to said sub-circuit;

a diode-connected MOS transistor connected parallel to said MOS transistor between said voltage supply bus and said sub-circuit to supply a standby voltage to said sub-circuit when said MOS transistor is deactivated; the diode-connected MOS transistor being contained in a doped well of a substrate; and a biasing unit configured to adjust said standby voltage by selectively connecting said doped well to one of a plurality of voltage sources, thereby adjusting the threshold voltage of the MOS transistor, resulting in a corresponding change in a voltage drop across the diode-connected MOS transistor, and adjusting the standby voltage for the sub-circuit.

37. The controller as recited in claim 36, wherein the biasing unit further comprises fusible links configured to selectively provide hard-wired connections between the doped well and respective ones of said plurality of voltage sources.

38. The controller of claim 36, wherein the biasing unit further comprises at least one fusible link configured to selectively connect the doped well to at least one of a source of the diode-connected MOS transistor, a drain of the diode-connected MOS transistor, and an input/output supply voltage source that is associated with the sub-circuit.

* * * * *